(12) United States Patent
Lee

(10) Patent No.: US 6,528,394 B1
(45) Date of Patent: Mar. 4, 2003

(54) GROWTH METHOD OF GALLIUM NITRIDE FILM

(75) Inventor: Seong-kuk Lee, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/497,171

(22) Filed: Feb. 3, 2000

(30) Foreign Application Priority Data

Feb. 5, 1999 (KR) .............................................. 99-3957

(51) Int. Cl.$^7$ ............................................. H01L 21/36
(52) U.S. Cl. ...................... 438/478; 438/479; 438/483
(58) Field of Search .............................. 438/22, 24, 46, 438/479, 767, 796, 718, 483, 493; 117/89

(56) References Cited

U.S. PATENT DOCUMENTS

| | | | | |
|---|---|---|---|---|
| 5,620,557 A | * | 4/1997 | Manabe et al. ............. | 438/507 |
| 5,633,192 A | * | 5/1997 | Moutakas et al. ............ | 438/46 |
| 5,864,573 A | * | 1/1999 | Miura et al. .................. | 372/45 |
| 6,001,173 A | * | 12/1999 | Bestwick et al. ............. | 117/89 |
| 6,086,673 A | * | 6/2000 | Molner ......................... | 117/90 |
| 6,111,277 A | * | 8/2000 | Ikeda ........................... | 257/99 |
| 6,218,280 B1 | * | 4/2001 | Kryliouk et al. .............. | 438/46 |
| 6,290,774 B1 | * | 9/2001 | Solmon et al. ............... | 117/98 |
| 6,294,016 B1 | * | 9/2001 | Kim et al. ..................... | 117/4 |
| 2002/0028291 A1 | * | 3/2002 | Shibata et al. ......... | 427/255.39 |

FOREIGN PATENT DOCUMENTS

| | | | |
|---|---|---|---|
| EP | 0865088 | * | 9/1998 |
| JP | 60-2073321 | | 10/1995 |
| JP | 08-213326 | | 8/1996 |

OTHER PUBLICATIONS

Maruska, H.P. et al., "The Preparation and Properties of Vapor–Deposited Single–Crystal–Line GaN." Applied Physics Letters, vol. 15, No. 10, Nov. 15, 1969.

Yoshida, S., et al., "Improvements on the electrical and luminescent properties of reactive molecular beam epitaxially grown GaN films by using AlN–coated sapphire substrates." Applied Physics Letters, vol. 42, No. 5, Mar. 1, 1983, pp. 427–429.

Amano, H., et al., "Metalorganic vapor phase epitaxial growth of a high quality GaN film using an AlN buffer layer." Applied Physics Letters, vol. 48, No. 5, Feb. 3, 1986, pp. 353–355.

Nakamura, Shuji, "GaN Growth Using GaN Buffer Layer." Japanese Journal of Applied Physics, vol. 30, No. 10A, Oct. 1991, pp. L1705—L1707.

Detchprohm, T., et al., "The growth of thick GaN film on sapphire substrate by using ZnO buffer layer." Journal of Crystal Growth 128 (1993), pp. 384–390.

Manasevit, H.M., et al., "The Use of Metalorganics in the Preparation of Semiconductor Materials." Metalorganics and Semiconductor Materials, vol. 118, No. 11, Nov. 1971, pp. 1864–1868.

* cited by examiner

Primary Examiner—Savitri Mulpuri
(74) Attorney, Agent, or Firm—Burns, Doane, Swecker & Mathis

(57) ABSTRACT

A method of growing a high quality gallium nitride (GaN) film at a high growth rate, which is used in homoepitaxy blue laser diodes or electronic devices. In the GaN film growth method, a bare sapphire substrate is nitridated in a reactor, and then sequentially exposed to a surface pretreatment with a gas mixture of ammonia ($NH_3$) and hydrochloric acid (HCl), and an additional nitridation. The obtained GaN film has a mirror surface with slight roughness.

17 Claims, 5 Drawing Sheets

GROWTH METHOD OF GALLIUM NITRIDE FILM

This application claims priority under 35 U.S.C. §§119 and/or 365 to 99-3957 filed in Korea on Feb. 5, 1999; the entire content of which is hereby incorporated by reference.

BACKGROUND OF THE INVENTION

1. Field of the Invention

The present invention relates to a method of growing a high quality gallium nitride (GaN) film at a high growth rate, which is useful in applications such as homoepitaxy blue laser diodes or electronic devices.

2. Description of the Related Art

Growth methods used to deposit GaN films on a sapphire substrate can be classified into metal organic vapor phase epitaxy (MOVPE), molecular beam epitaxy (MBE) and hydride vapor phase epitaxy (HVPE). (references: [1] H. P. Maruska and J. J. Tietjin, Appl. Phys. Lett. 15 (1969), pp. 327; [2] H. M. Manasevit, F. M. Erdmann and W. I. Simpson, J. Electrochem. Soc. 118 (1971), pp. 1864; [3] S. Yoshida, S. Misawa and S. Gonda, Appl. Phys. Lett. 42 (1983), pp. 427). Among these three techniques, HVPE has an advantage of a high growth rate, which is several tens of times higher than that of the other two techniques, so that it is suitable for growing a thick film or bulk monocrystalline. However, HVPE cannot provide high quality GaN films with a mirror surface at the high growth rate.

High quality GaN films having a mirror surface have been obtained by MOVPE and by incorporating a buffer layer into the structure. However, MOPVE is not appropriate for growing a thick GaN film due to its low growth rate in the order of 1 $\mu$m/hour. Due to this reason, HVPE has been adapted in GaN film growth on a sapphire substrate in spite of the resulting GaN film having a rough surface and poor crystalline characteristics. Also, to avoid this problem, aluminum nitride (AlN), zinc oxide (ZnO) or low-temperature GaN films have been used as an interface buffer layer, without a distinct quality improvement in the resulting GaN films. (references: [4] H. Amano, N. Sawaki, and Y. Toyada, Appl. Phys. Lett. 48 (1986), pp. 353; [5] S. Nakamura, Jpn. J. Appl. Phys. 30 (1991), pp. 1705; and [6] T. Detchprohm, H. Amano, K. Hiramatsu and I. Akasaki, J. Cryst. Growth 128 (1993), pp. 384).

Conventional procedures for growing GaN films by HVPE are illustrated in FIG. 1. Referring to FIG. 1, first a sapphire substrate is loaded into a reactor for HVPE (S1). Then ammonia (NH$_3$) reaction gas is supplied onto the substrate for nitridating the surface of the sapphire substrate (S2) and then growing a GaN film on the substrate (S3). In either case, in the step S1, prior to the introduction of the sapphire substrate into the reactor, a buffer layer is grown with AlN or ZnO to a thickness of several hundreds of angstroms by sputtering or chemical vapor deposition (CVD). Then, the steps S2 and S3 are carried out. However, the growth of the GaN layer by the HVPE illustrated in FIG. 1 is not enough, resulting in rough surface characteristics as can be seen in FIG. 2A. Furthermore, an X-ray rocking curve shown in FIG. 2B exhibits poor crystalline characteristics at a full width of half maximum (FWHM) value of 1000 arcsec or more (the GaN film 2 $\mu$m thick) The term "nitridation" refers to the unintentional formation of thin film, for example, an AlN film, on a sapphire substrate by flow of NH$_3$ reaction gas onto the substrate, but not to intentional formation of a buffer layer of AlN.

SUMMARY OF THE INVENTION

It is an object of the present invention to provide a method of growing a high quality gallium nitride (GaN) film at a high growth rate, which is able to provide a mirror-like surface by using a modified hydride vapor phase epitaxy (HVPE) technique on the resulting GaN film, wherein good crystalline characteristics can be obtained even at a high growth rate.

In one embodiment, the present invention provides a method of growing a GaN film on a sapphire substrate by HVPE, the method including: loading the sapphire substrate into a reactor; nitridating the resulting sapphire substrate; treating the sapphire substrate by flowing a gas mixture of ammonia (NH$_3$) and hydrochloric acid (HCl) onto the sapphire substrate; nitridating the sapphire substrate treated with the gas mixture; and growing the GaN film on the sapphire substrate.

Preferably, a silicon (SiC) carbide substrate, an oxide substrate or a carbide substrate is used in place of the sapphire substrate.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Figure 3:
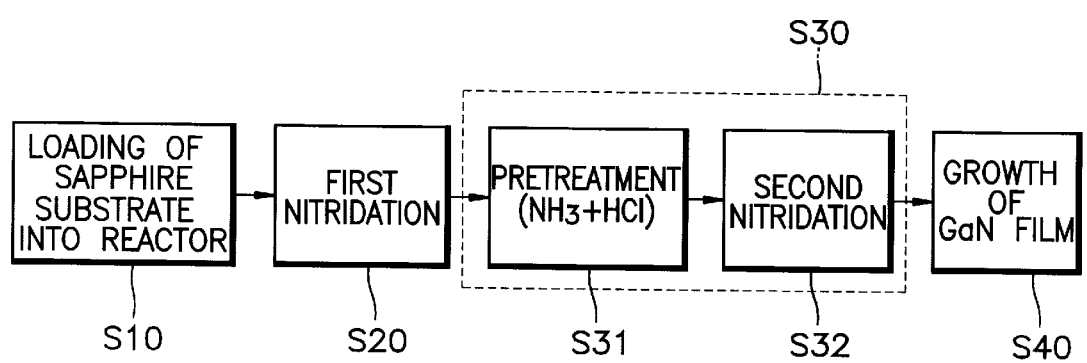
FIG. 3 is a flow diagram illustrating a process for growing a GaN film by modified HVPE according to the present invention.

In gallium nitride (GaN) growth according to the present invention, a modification of a conventional hydride vapor phase epitaxial (HVPE) technique has been adapted to grow a GaN film. The method of growing GaN film according to the present invention is illustrated in FIG. 3. Referring to FIG. 3, a sapphire substrate is loaded into a reactor (S10) and then ammonia (NH$_3$) reaction gas is flowed onto the sapphire substrate for nitridating the substrate (first nitridation) (S20). The steps S10 and S20 are identical to those in the conventional HVPE. Then, an additional nitridation is carried out (S30). In the step 30, the surface of the resulting sapphire substrate is treated with a gas mixture of NH$_3$ and hydrochloric acid (HCl) (S31), and then exposed to a second nitridation (S32). Then, a GaN film is grown on the resulting substrate (S40).

Unlike the conventional HVPE in which a GaN film is grown after the first nitridation on the substrate, the modified HVPE according to the present invention further includes the treatment of the sapphire substrate with the gas mixture of $NH_3$ and HCl in the reactor and the succeeding nitridation, thereby resulting in a GaN film with improved surface characteristics. Also, during the growth process, the temperature of a source gas, the growth temperature in the reaction chamber, and the ratio of Group-III elements to Group-IV elements in the Periodic Table (referred to as simply Group III-to-IV ratio) are controlled.

Figure 4A:
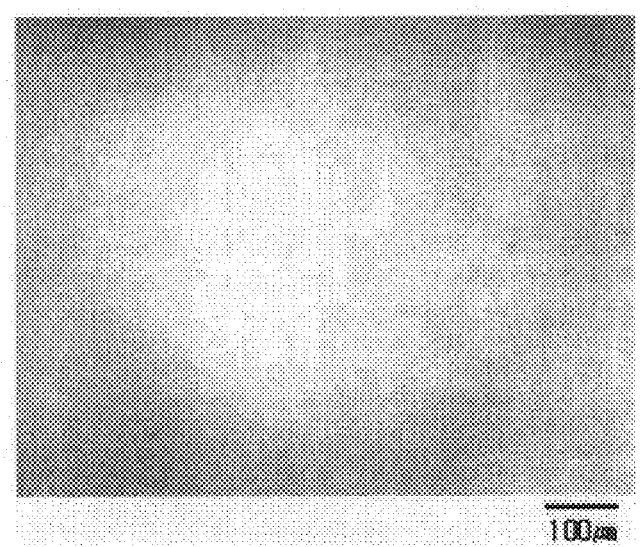
FIGS. 4A and 4B are a topography and an X-ray rocking curve of the GaN film grown by the sequence illustrated in FIG. 3, respectively.
Figure 4B:
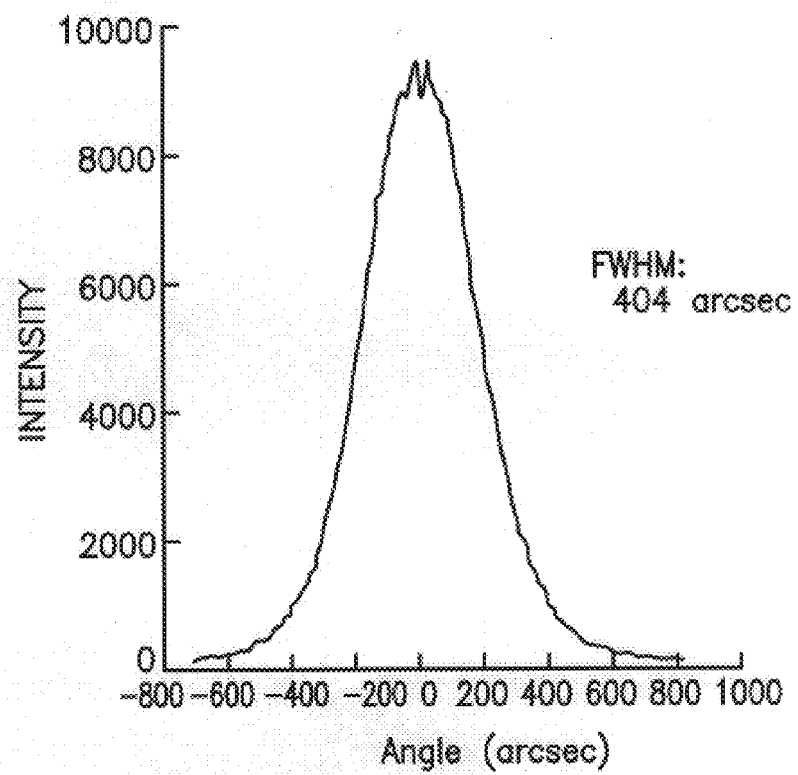

In the GaN film growth technique according to the present invention, HVPE which has the advantage of a high growth rate is adopted, and the GaN film is directly grown on the sapphire substrate without forming an interface buffer layer. In spite of the use of the HVPE and the lack of the interface buffer layer, the resulting GaN film has a high-quality mirror surface with slight roughness as shown in FIG. 4A. Also, as can be seen from an X-ray rocking curve of FIG. 4B, the grown GaN film has good crystalline characteristics at a FWHM value of about 400 arcsec. This quality of the GaN film is comparable with that of a GaN film grown by combination of metal organic vapor phase epitaxy (MOVPE) and a buffer layer. This result supports that a high GaN film can be grown at a high growth rate by the HVPE, without forming a buffer layer.

The GaN film growth according to the present invention is characterized in the following. First, there is formed no buffer layer, which was commonly formed to eliminate the problem with lattice mismatch between a sapphire substrate and a GaN film grown thereon. Second, by treating the surface of the sapphire substrate, a high-quality GaN film with a mirror surface can be obtained even by using the HVPE, at a high growth rate in the order of 50 $\mu$m/hours. This sapphire substrate with GaN film can be adopted as a heteroepitaxy substrate for blue laser diode (LD) manufacture, in place of using metal organic chemical vapor deposition (MOCVD) or MOVPE therefor.

Also, the GaN film grown on the sapphire substrate can be manufactured into a light-emitting diode (LED) via n-type and p-type doping. Also, due to the high growth rate, a thick GaN film can be obtained within a short period of time. In some cases, the sapphire substrate can be removed from the GaN film in the subsequent process, resulting in a GaN substrate. This GaN substrate can be used as a homoepitaxial blue LD or electronic device.

Figure 1:
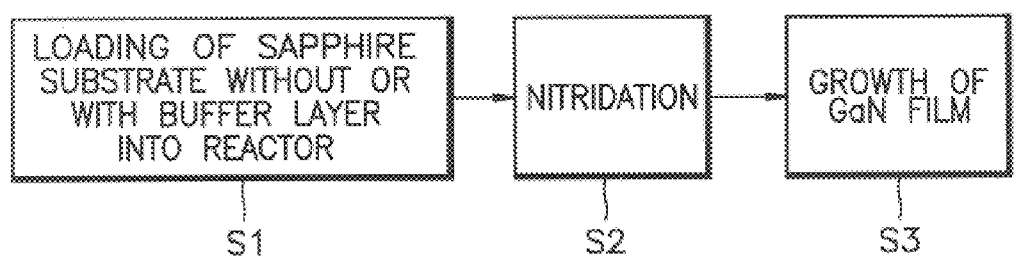
FIG. 1 is a flow diagram illustrating conventional growth procedures of a gallium nitride (GaN) film by hydride vapor phase epitaxy (HVPE)
Figure 2A:
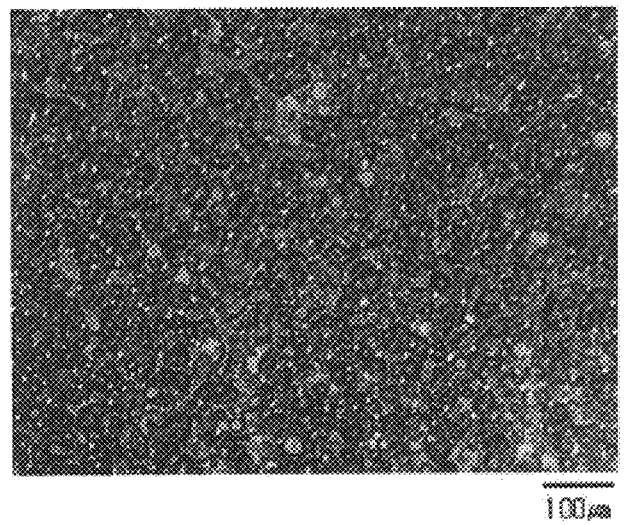
FIGS. 2A and 2B are a topography and an X-ray roping curve, respectively, of the GaN film grown by the sequence illustrated in FIG. 1.
Figure 2B:
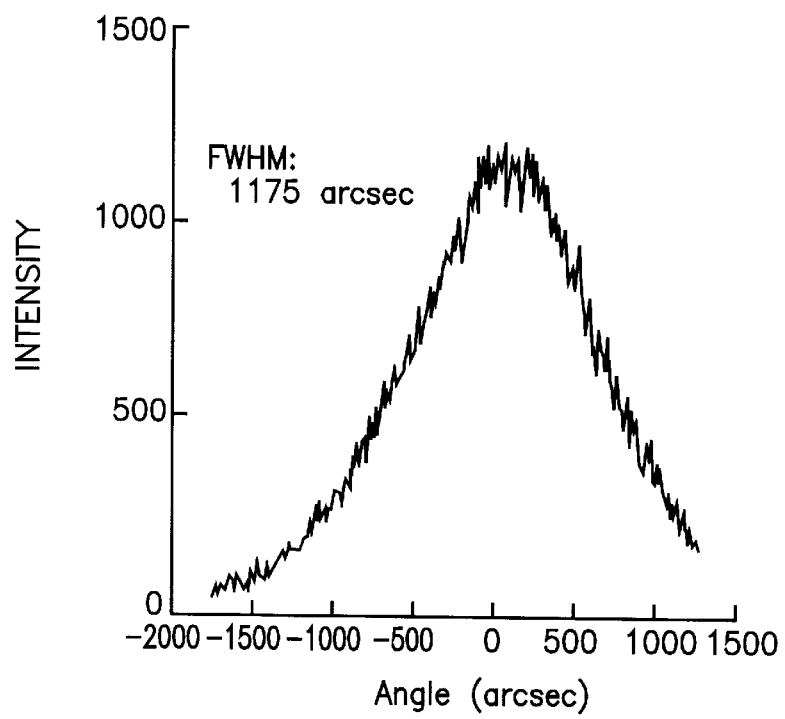
Figure 5:
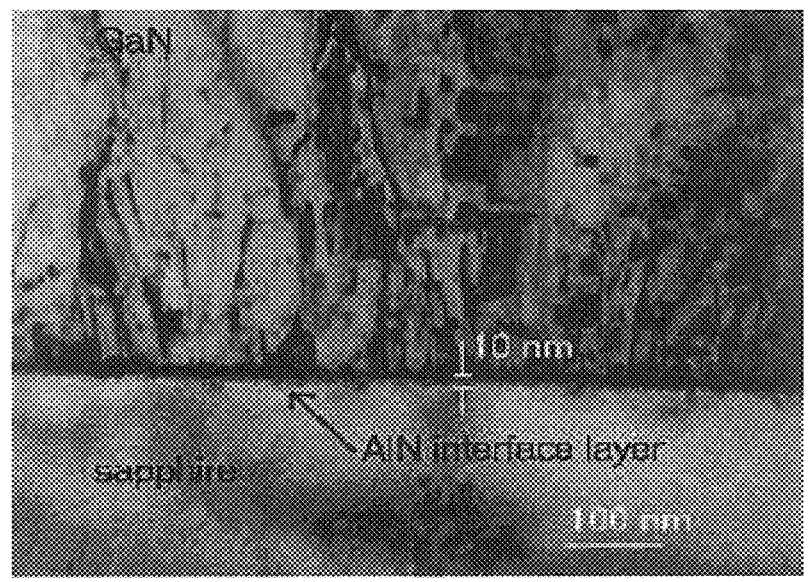
FIG. 5 is a transmission electron microscopy (TEM) photo of a cross section of the GaN film grown by the conventional sequence in FIG. 1.
Figure 6:
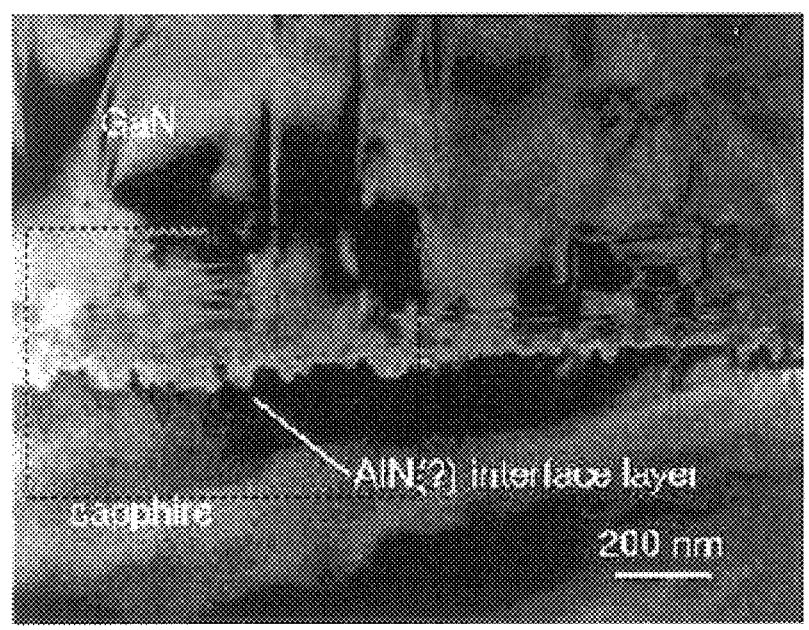
FIG. 6 is a TEM photo of a cross section of the GaN film grown by the sequence in FIG. 3.
Figure 7:
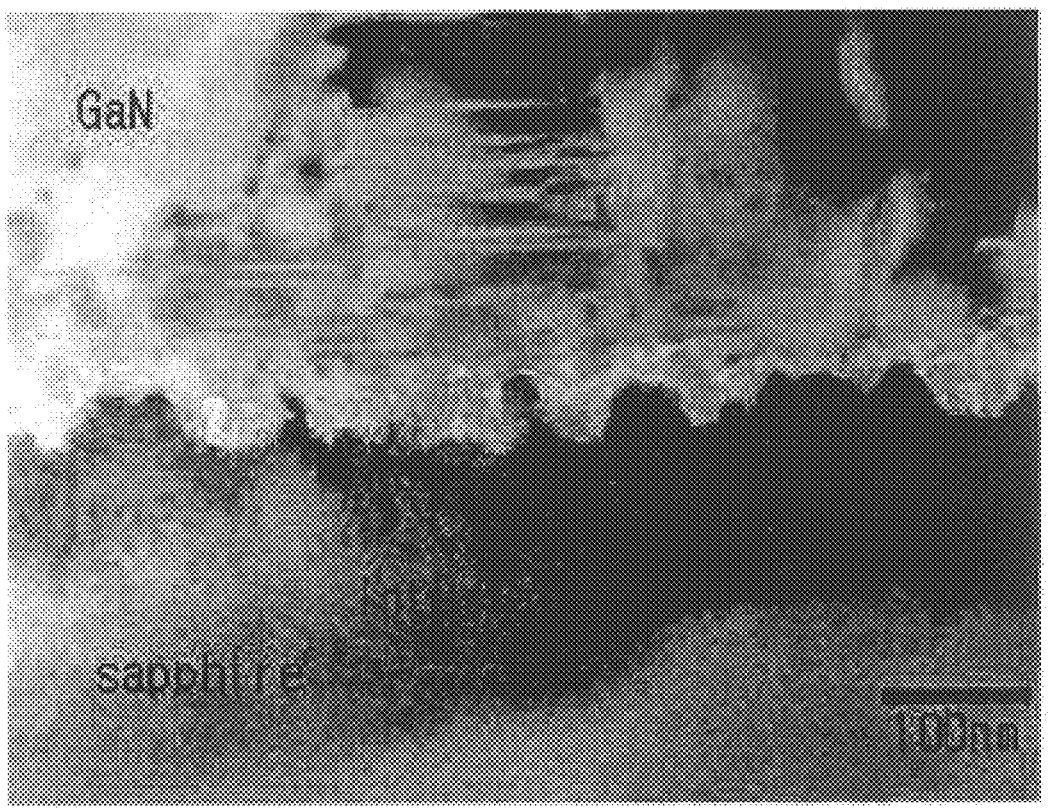
FIG. 7 is a TEM photo enlarged for illustration, taken from the portion indicated by the dashed lines in FIG. 6.

FIG. 5 is a transmission electron microscopy (TEM) photo of a cross section of the GaN film grown through one nitridation by the conventional HVPE process illustrated in FIG. 1; FIG. 6 is a TEM photo of a cross section of the GaN film grown by the HVPE in accordance with the present invention, in which the first nitridation is followed by the pretreatment with the gas mixture of $NH_3$ and HCl and the second nitridation to grow a GaN film; and FIG. 7 is a TEM photo enlarged for illustration, of the portion indicated by the dashed lines in FIG. 6. From these photos, the effects of the pretreatment on the interface between the grown GaN film and the sapphire substrate can be easily noted.

First, referring to an AlN interface layer, which seems to be formed between the GaN film and the sapphire substrate, the interface profile (FIG. 5) obtained by the conventional growth method shows a flat shape whereas the interface profile (FIGS. 6 and 7) according to the present invention has a concave-convex shape. The concave-convex shaped interface profile results from the etching of the sapphire substrate by the gas mixture of $NH_3$ and HCl.

The second difference is in the defect density of the grown GaN film. As can be seen from FIGS. 5 and 6, the GaN film according to the present invention has a more clean and simple cross section compared to that grown by the conventional technique.

As described above, it should be noted that the crystalline characteristics of the GaN film can be improved by the pretreatment with the gas mixture of $NH_3$ and HCl, and the good crystalline characteristics result from the change of the interface profile between the sapphire substrate and the GaN film grown thereon.

For further verification of the effects of the gas mixture pretreatment using $NH_3$ and HCl, GaN films were grown by four different procedures. For the processes, GaN films were grown by HVPE in a horizontal open flow reactor under atmospheric pressure. Ga and $NH_3$ were used as precursors, and nitrogen ($N_2$) was used as a carrier gas. The processes are as follows.

<Process 1>

A sapphire substrate was loaded into a reactor, $NH_3$ reaction gas was flowed onto the substrate for a first nitridation. The resulting substrate was pretreated with a $NH_3$ and HCl gas mixture, and then exposed to a second nitridation using only $NH_3$ to grow a GaN film on the sapphire substrate. These procedures were the same as those of the present invention illustrated above;

<Process 2>

A sapphire substrate was loaded into the reactor, the $NH_3$ reaction gas was flowed onto the substrate for the first nitridation, and then successively exposed to the pretreatment with the $NH_3$ and HCl gas mixture to grow a GaN film on the resulting substrate;

<Process 3>

A sapphire substrate was loaded into the reactor, the bare sapphire substrate was pretreated with the $NH_3$ and HCl gas mixture, and only $NH_3$ gas was flowed on the substrate for nitridating the resulting substrate to grow a GaN film thereon; and <Process 4>

A sapphire substrate was loaded into the reactor, and only the pretreatment with the $NH_3$ and HCl gas mixture was carried out on the bare substrate to grow a GaN film thereon.

Here, the other processing parameters, except for the procedures illustrated above, were the same for all the processes. That is, the temperature of the source gas, the growth temperature, and the Group III-to-IV ratio were controlled to give a growth rate of approximately 50 $\mu$m/hour.

As a result, only the surface roughness of the GaN film slightly differed for the four types of samples. Thus, it can be concluded that as long as the surface pretreatment with the $NH_3$ and HCl gas mixture is carried out on the sapphire substrate, satisfactory surface characteristics can be obtained without performing the first and second nitridation. However, the growth of the GaN film was the most stable for the samples exposed to all the three processes (first nitridation, pretreatment and second nitridation), i.e., Process 1.

Also, a silicon carbide substrate, an oxide substrate or a carbide substrate can be used instead of the sapphire substrate.

As described above, unlike the conventional HVPE in which a GaN film was grown on a sapphire substrate through one nitridation, the GaN film growth process according to the present invention includes the first nitridation on a bare sapphire substrate in a reactor; the surface pretreatment with the $NH_3$ and HCl gas mixture; and the second nitridation, and thus a GaN film with a slight surface roughness, i.e., with a mirror surface, can be obtained: An X-ray rocking curve of the GaN film shows good surface characteristics at a FWHM value of 400 arcsec. Thus, a high quality GaN film, which is comparable with a GaN film grown by the MOVPE together with a buffer layer, can be grown by the HVPE at a high growth rate, without the need to form the buffer layer.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of growing gallium nitride (GaN) film on a sapphire substrate by hydride vapor phase epitaxy (HVPE), the method comprising:
    loading the sapphire substrate into a reactor;
    treating the sapphire substrate by flowing a gas mixture of ammonia ($NH_3$) and hydrogen chloride (HCl) onto the sapphire substrate; and
    growing the GaN film on the sapphire substrate, wherein the step of growing the GaN film is conducted after the step of treating the sapphire substrate.

2. The growth method of claim 1, further comprising nitridating the resulting sapphire substrate before the treatment with the $NH_3$ and HCl gas mixture.

3. The growth method of claim 1, further comprising nitridating the resulting sapphire substrate after the treatment with the $NH_3$ and HCl gas mixture.

4. The growth method of claim 1, wherein a silicon carbide substrate, an oxide substrate or a carbide substrate is used instead of the sapphire substrate.

5. A method of growing gallium nitride (GaN) film on a carbide substrate by hydride vapor phase epitaxy (HVPE), the method comprising:
    loading the carbide substrate into a reactor;
    treating the carbide substrate by flowing a gas mixture of ammonia ($NH_3$) and hydrogen chloride (HCl) onto the carbide substrate; and
    growing the GaN film on the carbide substrate, wherein the step of growing the GaN film is conducted after the step of treating the carbide substrate.

6. The growth method of claim 5, further comprising nitridating the resulting carbide substrate before the treatment with the $NH_3$ and HCl gas mixture.

7. The growth method of claim 5, further comprising nitridating the resulting carbide substrate after the treatment with the $NH_3$ and HCl gas mixture.

8. The growth method of claim 5, wherein the carbide substrate is a silicon carbide substrate.

9. The growth method of claim 8, further comprising nitridating the resulting silicon carbide substrate before the treatment with the $NH_3$ and HCl gas mixture.

10. The growth method of claim 8, further comprising nitridating the resulting silicon carbide substrate after the treatment with the $NH_3$ and HCl gas mixture.

11. The growth method of claim 2, further comprising nitridating the resulting sapphire substrate after the treatment with $NH_3$ and HCl gas mixture.

12. The growth method of claim 6, further comprising nitridating the resulting carbide substrate after the treatment with $NH_3$ and HCl gas mixture.

13. The growth method of claim 9, further comprising nitridating the resulting silicon carbide substrate after the treatment with $NH_3$ and HCl gas mixture.

14. The method of claim 1, wherein the GaN film is grown on the sapphire substrate by hydride vapor phase epitaxy.

15. The method of claim 5, wherein the GaN film is grown on the carbide substrate by hydride vapor phase epitaxy.

16. The method of claim 1, wherein the GaN film is grown on the sapphire substrate without an interface buffer layer present between the GaN film and the sapphire substrate.

17. The method of claim 5, wherein the GaN film is grown on the carbide substrate without an interface buffer layer present between the GaN film and the carbide substrate.

* * * * *